US012772422B2

(12) United States Patent
Hsiao et al.

(10) Patent No.: US 12,772,422 B2
(45) Date of Patent: Oct. 20, 2026

(54) RACK WITH HEAT-DISSIPATION SYSTEM, POWER SUPPLY SYSTEM FOR RACK WITH HEAT-DISSIPATION SYSTEM, AND POWER CONTROL SYSTEM OF RACK HEAT-DISSIPATION SYSTEM

(71) Applicant: CHICONY POWER TECHNOLOGY CO., LTD., New Taipei City (TW)

(72) Inventors: Yung-Hung Hsiao, New Taipei City (TW); Chia-Hsien Yen, New Taipei City (TW); Da-Shian Chen, New Taipei City (TW); Hao-Chieh Chang, New Taipei City (TW)

(73) Assignee: CHICONY POWER TECHNOLOGY CO., LTD., New Taipei City (TW)

( * ) Notice: Subject to any disclaimer, the term of this patent is extended or adjusted under 35 U.S.C. 154(b) by 325 days.

(21) Appl. No.: 18/081,056

(22) Filed: Dec. 14, 2022

(65) Prior Publication Data

US 2024/0164068 A1 May 16, 2024

(30) Foreign Application Priority Data

Nov. 11, 2022 (TW) .................................. 111143208

(51) Int. Cl.
*H05K 7/20* (2006.01)
*H02J 9/06* (2006.01)
*H05K 7/14* (2006.01)

(52) U.S. Cl.
CPC ................ *H05K 7/209* (2013.01); *H02J 9/06* (2013.01); *H05K 7/1492* (2013.01);
(Continued)

(58) Field of Classification Search
CPC ...... H04J 4/00; H02J 3/10; H02J 1/102; H02J 9/06; H02J 9/062; H02J 9/061;
(Continued)

(56) References Cited

U.S. PATENT DOCUMENTS 5,945,746 A * 8/1999 Tracewell .......... H05K 7/20572 165/185
8,848,362 B1 * 9/2014 Che .......................... G05B 9/02 702/132
(Continued)

FOREIGN PATENT DOCUMENTS

CN 106208347 A 12/2016
CN 110829583 A 2/2020
(Continued)

*Primary Examiner* — Gage Crum
(74) *Attorney, Agent, or Firm* — MUNCY, GEISSLER, OLDS & LOWE, P.C.

(57) ABSTRACT

A power control system of a rack heat-dissipation system, which receives output voltages of a rack power supply and a module power supply, includes a first control module and a second control module operating in parallel. The first control module includes a first switching unit, a first voltage converting unit and a first monitoring unit. The second control module includes a second switching unit, a second voltage converting unit and a second monitoring unit. The first monitoring unit is connected to the rack power supply, the module power supply, the first switching unit and the first voltage converting unit, and the second monitoring unit is connected to the rack power supply, the module power supply, the second switching unit and the second voltage converting unit. The heat dissipation system can be kept in the normal operation even if one of the control modules is failed.

11 Claims, 10 Drawing Sheets

(52) U.S. Cl.
CPC ..... *H05K 7/20272* (2013.01); *H05K 7/20781* (2013.01); *H05K 7/20909* (2013.01)

(58) Field of Classification Search
CPC ... G06F 1/263; G06F 1/30; G06F 1/28; G06F 1/26; G06F 1/266; G06F 1/3206; G06F 1/305; G06F 11/2015; G06F 1/189; H05K 7/1492; H05K 7/1432; H05K 7/1457; H05K 7/1482; H05K 7/2089; H05K 7/20; H05K 7/209; H05K 7/20272; H05K 7/20909; H05K 7/20281; H05K 7/20381; H05K 7/207; H05K 7/20836; H05K 7/20781
USPC ............ 713/320, 340, 324; 307/43, 112, 24; 361/688–704
See application file for complete search history.

(56) References Cited

U.S. PATENT DOCUMENTS

| | | | | |
|---|---|---|---|---|
| 9,658,667 | B2 * | 5/2017 | Chen | G06F 1/263 |
| 10,026,455 | B1 | 7/2018 | Miranda Gavillan et al. | |
| 10,523,049 | B2 * | 12/2019 | Toyoda | H02J 9/062 |
| 10,992,170 | B2 * | 4/2021 | Hsu | H02J 9/06 |
| 11,576,283 | B2 * | 2/2023 | Chen | H05K 7/20627 |
| 2004/0221604 | A1 * | 11/2004 | Ota | H05K 7/20781 361/691 |
| 2005/0099750 | A1 * | 5/2005 | Takahashi | H02J 9/061 361/92 |
| 2006/0082222 | A1 * | 4/2006 | Pincu | G06F 1/3203 307/29 |
| 2009/0072623 | A1 * | 3/2009 | Liao | H02J 9/061 307/65 |
| 2009/0144568 | A1 | 6/2009 | Fung | |
| 2011/0203779 | A1 * | 8/2011 | Dawes | H02J 9/062 307/64 |
| 2014/0070616 | A1 * | 3/2014 | Shih | G06F 1/30 307/64 |
| 2015/0008746 | A1 * | 1/2015 | Youn | H02J 1/102 307/65 |
| 2015/0019021 | A1 * | 1/2015 | Che | H05K 7/1457 700/275 |
| 2015/0028784 | A1 | 1/2015 | Kim et al. | |
| 2015/0109708 | A1 * | 4/2015 | Cheng | H02H 9/025 361/93.9 |
| 2015/0200567 | A1 * | 7/2015 | Huang | H02J 9/062 307/64 |
| 2017/0047772 | A1 * | 2/2017 | Wang | H05K 7/1492 |
| 2017/0049009 | A1 * | 2/2017 | Steinke | H05K 7/20736 |
| 2017/0108903 | A1 * | 4/2017 | Che | G05B 9/02 |
| 2017/0265325 | A1 * | 9/2017 | Klikic | H02J 9/061 |
| 2017/0279302 | A1 * | 9/2017 | Toyoda | H02J 9/062 |
| 2017/0339804 | A1 * | 11/2017 | Ingalz | H05K 7/20736 |
| 2018/0046232 | A1 * | 2/2018 | Wang | H05K 7/20281 |
| 2018/0083453 | A1 * | 3/2018 | Chang | H02J 3/381 |
| 2019/0157903 | A1 * | 5/2019 | Umezawa | H02M 7/77 |
| 2023/0052000 | A1 * | 2/2023 | Lu | G06F 1/263 |

FOREIGN PATENT DOCUMENTS

| | | | | |
|---|---|---|---|---|
| CN | 112099551 | A | | 12/2020 |
| CN | 108444053 | B | | 5/2021 |
| CN | 113238644 | B | | 10/2021 |
| CN | 114158235 | A | | 3/2022 |
| CN | 216387952 | U | | 4/2022 |
| CN | 114860053 | A | | 8/2022 |
| CN | 114944697 | A | | 8/2022 |
| CN | 115038303 | A | | 9/2022 |
| CN | 217642308 | U | | 10/2022 |
| CN | 211860932 | U | | 11/2022 |
| JP | 2010025374 | A | | 2/2010 |
| JP | 2015027255 | A | | 2/2015 |
| KR | 101853231 | B1 | | 4/2018 |
| KR | 20210049466 | A | | 5/2021 |
| TW | 201640245 | A | | 11/2016 |
| TW | I743771 | B | | 10/2021 |
| TW | 202143598 | A | * | 11/2021 |

* cited by examiner

RACK WITH HEAT-DISSIPATION SYSTEM, POWER SUPPLY SYSTEM FOR RACK WITH HEAT-DISSIPATION SYSTEM, AND POWER CONTROL SYSTEM OF RACK HEAT-DISSIPATION SYSTEM

CROSS REFERENCE TO RELATED APPLICATIONS

This Non-provisional application claims priority under 35 U.S.C. § 119(a) on Patent Application No(s). 111143208 filed in Taiwan, Republic of China on Nov. 11, 2022, the entire contents of which are hereby incorporated by reference.

BACKGROUND

Technology Field

The disclosure relates to a rack with a heat-dissipation system and, in particular, to a rack with a heat-dissipation system, a power supply system for a rack with a heat-dissipation system and a power control system of a rack heat-dissipation system that can improve the reliability level in the computer room evaluation and the repairing convenience.

Description of Related Art

With the continuous development of the cloud application market, business opportunities for related applications such as virtualization performance management, massive data analysis, cloud service management, and enterprise mobile device management will gradually emerge. In the expansion stage of cloud computing center upgrades, the demand for servers will increase significantly. Although the data center has great computing capacity, its power consumption is correspondingly high. In the current artificial intelligence and high-performance computing era, the power consumption of the electronic hardware of the server is much higher than the typical servers, and the increase in power consumption is followed by the generation of more waste heat. Therefore, the rack, as shown in FIG. 1 and FIG. 2, used to accommodate a large number of servers must have a water cooling distribution unit (CDU) for removing the waste heat generated by the servers so as to maintain the normal operations of servers.

As shown in FIGS. 1 to 4, the conventional rack with a heat-dissipation system includes a rack body 1, a heat-dissipation system 2, a rack power supply 3, a power supply unit 4, and a power control system 5.

Referring to FIGS. 1 and 2, the rack body 1 is a hollow case for accommodating a plurality of electronic apparatuses 6, such as servers that generate a lot of waste heat during operation.

Referring to FIG. 3, the heat-dissipation system 2, which is configured for cooling the electronic apparatuses 6, includes a water circulation system 20 installed in the rack body 1, a fan module 21 installed in the rack body 1 for performing heat exchange with the water circulation system 20, and a motor module 22 installed in the rack body 1 for driving the water circulation system 20.

The water circulation system 20 includes a cold water pipe 200 for transmitting the cold water from a water tank 205 to the electronic apparatuses 6 for heat dissipation, a heated water pipe 201 for outputting the heated water, after absorbing the heat generated by the electronic apparatuses 6, and a recycle water pipe 202 for transmitting the cold water, after heat exchange with the fan module 21, back the water tank 205. The water circulation system 20 is driven by the motor module 22.

As shown in FIG. 4, the heat-dissipation system 2 further includes a detection module 23 for detecting the temperature value, the flow value and the pressure value of the water circulation system 20 and the temperature value inside the rack body 1, and a control module 24 for controlling the operations of the motor module 22 and the fan module 21 according to the values detected by the detection module 23.

The rack power supply 3 is generally arranged inside the rack body 1 and located at the top of the rack body 1. The rack power supply 3 can output voltages for providing the required electric power of the entire rack.

The power supply unit 4 is generally arranged at the bottom of the rack body 1 for providing the required electric power of the heat-dissipation system 2. The output voltage of the power supply unit 4 is identical to the output voltage of the rack power supply 3.

The power control system 5 includes a voltage converting unit 51 for receiving the output voltage from the power supply unit 4. The power control system 5 is fixed and installed on a connector interface 7, which is arranged inside the rack body 1 for electrically connecting the voltage converting unit 51 to the motor module 22, the detection module 23 and the control module 24. The power converting unit 51 receives the output voltage of the power supply unit 4 and outputs the required voltages for the motor module 22, the detection module 23 and the control module 24.

However, the conventional rack has the following disadvantages. Since the power control system 5 includes only one voltage converting unit 51, if the electronic components of the voltage converting unit 51 is damaged, the voltage converting unit 51 will be failed to operate, thereby causing the motor module 22, the detection module 23 and the control module 24 of the heat-dissipation system 2 to shut down, and then causing the entire rack to shut down due to the inability to dissipate heat. This can greatly reduce the reliability level of the computer room evaluation and cause huge business loss. In addition, since the connector interface 7 is fixed and installed inside the rack body 1, if the electronic components of the voltage converting unit 51 need to be repaired due to damage, the difficulty of repairing will be greatly increased. On the other hand, as shown in FIG. 4, since the output voltages of the rack power supply 3 and the power supply unit 4 are input to the fan module 21 at the same time, the fan module 21 must select one of them as the power supply. Because the output voltage of the power supply unit 4 is identical to the output voltage of the rack power supply 3, the power supply unit 4 in the heat-dissipation system 2 is forced to share the power consumption required by the entire rack. In addition, because the power supply unit 4 in the heat-dissipation system 2 cannot realize the load information of the power supply 3, it cannot achieve the current sharing, which may eventually cause the power supply unit 4 in the heat-dissipation system 2 to shut down, and thus case the shutdown of the entire rack due to the bad heat dissipation.

SUMMARY

In view of the foregoing, an objective of this disclosure is to provide a rack with a heat-dissipation system, a power supply system for a rack with a heat-dissipation system and a power control system of a rack heat-dissipation system.

To achieve the above, this disclosure discloses a power control system of a rack heat-dissipation system. The power control system receives output voltages of a rack power supply and a module power supply, and the heat-dissipation system includes a water circulation system for heat dissipation, a fan module for heat exchange with the water circulation system, and a motor module for driving the water circulation system. The power control system includes a first control module and a second control module that are operating in parallel. The first control module includes a first switching unit, a first voltage converting unit and a first monitoring unit. The first switching unit is electrically connected to the rack power supply and the module power supply. The first voltage converting unit is electrically connected to the first switching unit. The first voltage converting unit receives one or two of output voltages of the rack power supply and the module power supply, and outputs at least one first voltage for the fan module and/or the motor module of the heat-dissipation system. The first monitoring unit is electrically connected to the rack power supply, the module power supply, the first switching unit and the first voltage converting unit. When the first monitoring unit detects that the output voltages of the rack power supply and the module power supply are normal, the first monitoring unit controls the first switching unit to enable the first voltage converting unit to receive only one of the output voltages of the rack power supply and the module power supply, or to enable the first voltage converting unit to receive both of the output voltages of the rack power supply and the module power supply. The second control module includes a second switching unit, a second voltage converting unit and a second monitoring unit. The second switching unit is electrically connected to the rack power supply and the module power supply. The second voltage converting unit is electrically connected to the second switching unit. The second voltage converting unit receives one or two of the output voltages of the rack power supply and the module power supply, and outputs the at least one first voltage. The second monitoring unit is electrically connected to the rack power supply, the module power supply, the second switching unit and the second voltage converting unit. When the second monitoring unit detects that the output voltages of the rack power supply and the module power supply are normal, the second monitoring unit controls the second switching unit to enable the second voltage converting unit to receive only one of the output voltages of the rack power supply and the module power supply, or to enable the second voltage converting unit to receive both of the output voltages of the rack power supply and the module power supply.

In one embodiment, when the first monitoring unit detects that the output voltage of the rack power supply is abnormal, the first monitoring unit controls the first switching unit to enable the first voltage converting unit to receive only the output voltage of the module power supply; and when the second monitoring unit detects that the output voltage of the rack power supply is abnormal, the second monitoring unit controls the second switching unit to enable the second voltage converting unit to receive only the output voltage of the module power supply.

In one embodiment, when the first monitoring unit detects that the first voltage outputted by the first voltage converting unit is abnormal, the first monitoring unit controls the first switching unit to enable the first voltage converting unit to stop receiving the output voltages of the rack power supply and the module power supply, so that the first voltage converting unit stops outputting the abnormal first voltage; and when the second monitoring unit detects that the first voltage outputted by the second voltage converting unit is abnormal, the second monitoring unit controls the second switching unit to enable the second voltage converting unit to stop receiving the output voltages of the rack power supply and the module power supply, so that the second voltage converting unit stops outputting the abnormal first voltage.

In one embodiment, when the first monitoring unit detects that the output voltages of the rack power supply and the module power supply are normal, the first monitoring unit controls the first switching unit to enable the first voltage converting unit to receive only the output voltage of the module power supply; and when the second monitoring unit detects that the output voltages of the rack power supply and the module power supply are normal, the second monitoring unit controls the second switching unit to enable the second voltage converting unit to receive only the output voltage of the module power supply.

In one embodiment, the first voltage converting unit outputs the first voltage to the fan module of the heat-dissipation system, and the first voltage converting unit further outputs a second voltage to the motor module of the heat-dissipation system.

In one embodiment, the heat-dissipation system further includes a heat-dissipation system detection module electrically connected to the first monitoring unit, the second monitoring unit, the fan module and the motor module; and when the heat-dissipation system detection module detects that the fan module and/or the motor module are/is abnormal, the first monitoring unit and the second monitoring unit respectively control the first voltage converting unit and the second voltage converting unit to stop outputting the first voltage and/or the second voltage.

In addition, this disclosure also provides a power supply system, which is applied to a rack with a heat-dissipation system. The heat-dissipation system includes a water circulation system for heat dissipation, a fan module for heat exchange with the water circulation system, and a motor module for driving the water circulation system. The water circulation system, the fan module and the motor module are installed in the rack. The power supply system includes a rack power supply for outputting an output voltage, a module power supply installed in the rack by hot-swapping, a first control module, and a second control module. The module power supply includes a first power supply and a second power supply, and each of the first power supply and the second power supply outputs an output voltage identical to the output voltage of the rack power supply. The first control module and the second control module are installed in the rack by hot-swapping and operating in parallel. The first control module includes a first switching unit, a first voltage converting unit and a first monitoring unit. The first switching unit is electrically connected to the rack power supply, the first power supply and the second power supply. The first voltage converting unit is electrically connected to the first switching unit, and the first voltage converting unit receives one or two of the output voltages of the rack power supply and the module power supply, and outputs at least one first voltage and a second voltage. The first monitoring unit is electrically connected to the rack power supply, the first power supply, the second power supply, the first switching unit and the first voltage converting unit. When the first monitoring unit detects that the output voltages of the rack power supply, the first power supply and the second power supply are normal, the first monitoring unit controls the first switching unit to enable the first voltage converting unit to receive either the output voltage of the rack power supply or the output voltages of the first power supply and the second power supply, or to enable the first voltage converting unit to receive all of the output voltages of the rack power supply, the first power supply and the second power supply. The second control module includes a second switching unit, a second voltage converting unit and a second monitoring unit. The second switching unit is electrically connected to the rack power supply, the first power supply and the second power supply. The second voltage converting unit is electrically connected to the second switching unit, and the second voltage converting unit receives one or two of the output voltages of the rack power supply and the module power supply, and outputs the at least one first voltage and the second voltage. The second monitoring unit is electrically connected to the rack power supply, the first power supply, the second power supply, the second switching unit and the second voltage converting unit. When the second monitoring unit detects that the output voltages of the rack power supply, the first power supply and the second power supply are normal, the second monitoring unit controls the second switching unit to enable the second voltage converting unit to receive either the output voltage of the rack power supply or the output voltages of the first power supply and the second power supply, or to enable the second voltage converting unit to receive all of the output voltages of the rack power supply, the first power supply and the second power supply. The fan module is electrically connected to the first voltage converting unit and the second voltage converting unit for receiving the first voltage. The motor module is electrically connected to the first voltage converting unit and the second voltage converting unit for receiving the second voltage.

In one embodiment, when the first monitoring unit detects that the output voltage of the rack power supply is abnormal, the first monitoring unit controls the first switching unit to enable the first voltage converting unit to receive only the output voltages of the first power supply and the second power supply; and when the second monitoring unit detects that the output voltage of the rack power supply is abnormal, the second monitoring unit controls the second switching unit to enable the second voltage converting unit to receive only the output voltages of the first power supply and the second power supply.

In one embodiment, when the first monitoring unit detects that the first voltage and/or the second voltage outputted by the first voltage converting unit are/is abnormal, the first monitoring unit controls the first switching unit to enable the first voltage converting unit to stop receiving the output voltages of the rack power supply and the module power supply, so that the first voltage converting unit stops outputting the abnormal first voltage and/or the abnormal second voltage; and when the second monitoring unit detects that the first voltage and/or the second voltage outputted by the second voltage converting unit is abnormal, the second monitoring unit controls the second switching unit to enable the second voltage converting unit to stop receiving the output voltages of the rack power supply and the module power supply, so that the second voltage converting unit stops outputting the abnormal first voltage and/or the abnormal second voltage.

In one embodiment, when the first monitoring unit detects that the output voltages of the first power supply and the second power supply are normal, the first monitoring unit controls the first switching unit to enable the first voltage converting unit to receive only the output voltages of the first power supply and the second power supply; and when the second monitoring unit detects that the output voltages of the first power supply and the second power supply are normal, the second monitoring unit controls the second switching unit to enable the second voltage converting unit to receive only the output voltages of the first power supply and the second power supply.

In one embodiment, the heat-dissipation system further includes a heat-dissipation system detection module electrically connected to the first monitoring unit, the second monitoring unit, the fan module and the motor module; and when the heat-dissipation system detection module detects that the fan module and/or the motor module are/is abnormal, the first monitoring unit and the second monitoring unit respectively control the first voltage converting unit and the second voltage converting unit to stop outputting the first voltage and/or the second voltage.

In addition, this disclosure further provides a rack with a heat-dissipation system. The rack includes a rack body, a heat-dissipation system and a power supply system. The heat-dissipation system includes a water circulation system for heat dissipation, a fan module for heat exchange with the water circulation system, and a motor module for driving the water circulation system, and the water circulation system, the fan module and the motor module are installed in the rack body. The power supply system includes a rack power supply installed in the rack body for outputting an output voltage, a module power supply installed in the rack body by hot-swapping, a first control module and a second control module. The module power supply includes a first power supply and a second power supply, and each of the first power supply and the second power supply outputs the output voltage. The first control module and the second control module are installed in the rack body by hot-swapping and operating in parallel. The first control module includes a first switching unit, a first voltage converting unit and a first monitoring unit. The first switching unit is electrically connected to the rack power supply, the first power supply and the second power supply. The first voltage converting unit is electrically connected to the first switching unit, and the first voltage converting unit receives one or two of the output voltages of the rack power supply and the module power supply, and outputs at least one first voltage and a second voltage. The first monitoring unit is electrically connected to the rack power supply, the first power supply, the second power supply, the first switching unit and the first voltage converting unit. When the first monitoring unit detects that the output voltages of the rack power supply, the first power supply and the second power supply are normal, the first monitoring unit controls the first switching unit to enable the first voltage converting unit to receive either the output voltage of the rack power supply or the output voltages of the first power supply and the second power supply, or to enable the first voltage converting unit to receive all of the output voltages of the rack power supply, the first power supply and the second power supply. The second control module includes a second switching unit, a second voltage converting unit and a second monitoring unit. The second switching unit is electrically connected to the rack power supply, the first power supply and the second power supply. The second voltage converting unit is electrically connected to the second switching unit, and the second voltage converting unit receives one or two of the output voltages of the rack power supply and the module power supply, and outputs the at least one first voltage and the second voltage. The second monitoring unit is electrically connected to the rack power supply, the first power supply, the second power supply, the second switching unit and the second voltage converting unit. When the second monitoring unit detects that the output voltages of the rack power supply, the first power supply and the second power supply are normal, the second monitoring unit controls the second switching unit to enable the second voltage converting unit to receive either the output voltage of the rack power supply or the output voltages of the first power supply and the second power supply, or to enable the second voltage converting unit to receive all of the output voltages of the rack power supply, the first power supply and the second power supply. The fan module is electrically connected to the first voltage converting unit and the second voltage converting unit for receiving the first voltage. The motor module is electrically connected to the first voltage converting unit and the second voltage converting unit for receiving the second voltage.

In one embodiment, when the first monitoring unit detects that the output voltage of the rack power supply is abnormal, the first monitoring unit controls the first switching unit to enable the first voltage converting unit to receive only the output voltages of the first power supply and the second power supply; and when the second monitoring unit detects that the output voltage of the rack power supply is abnormal, the second monitoring unit controls the second switching unit to enable the second voltage converting unit to receive only the output voltages of the first power supply and the second power supply.

In one embodiment, when the first monitoring unit detects that the first voltage and/or the second voltage outputted by the first voltage converting unit are/is abnormal, the first monitoring unit controls the first switching unit to enable the first voltage converting unit to stop receiving the output voltages of the rack power supply, the first power supply and the second power supply, so that the first voltage converting unit stops outputting the abnormal first voltage and/or the abnormal second voltage; and when the second monitoring unit detects that the first voltage and the second voltage outputted by the second voltage converting unit is abnormal, the second monitoring unit controls the second switching unit to enable the second voltage converting unit to stop receiving the output voltages of the rack power supply, the first power supply and the second power supply, so that the second voltage converting unit stops outputting the abnormal first voltage and/or the abnormal second voltage.

In one embodiment, when the first monitoring unit detects that the output voltages of the first power supply and the second power supply are normal, the first monitoring unit controls the first switching unit to enable the first voltage converting unit to receive only the output voltages of the first power supply and the second power supply; and when the second monitoring unit detects that the output voltages of the first power supply and the second power supply are normal, the second monitoring unit controls the second switching unit to enable the second voltage converting unit to receive only the output voltages of the first power supply and the second power supply.

In one embodiment, the heat-dissipation system further includes a heat-dissipation system detection module electrically connected to the first monitoring unit, the second monitoring unit, the fan module and the motor module; and when the heat-dissipation system detection module detects that the fan module and/or the motor module are/is abnormal, the first monitoring unit and the second monitoring unit respectively control the first voltage converting unit and the second voltage converting unit to stop outputting the first voltage and/or the second voltage.

In one embodiment, the heat-dissipation system further includes a heat-dissipation system control module electrically connected to the heat-dissipation system detection module, the motor module and the fan module; and when the heat-dissipation system detection module detects that a temperature in the rack body is greater than a preset value, the heat-dissipation system control module controls the fan module and/or the motor module to increase a rotation speed of the fan module and/or a rotation speed of the motor module.

In one embodiment, the rack further includes a connector interface fixed in the rack body for electrically connecting the first voltage converting unit, the second voltage converting unit, the fan module and the motor module.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

With reference to FIGS. 5 to 8, a rack of this embodiment includes a rack body A1, a heat-dissipation system A2 and a power supply system 8.

Figure 1:
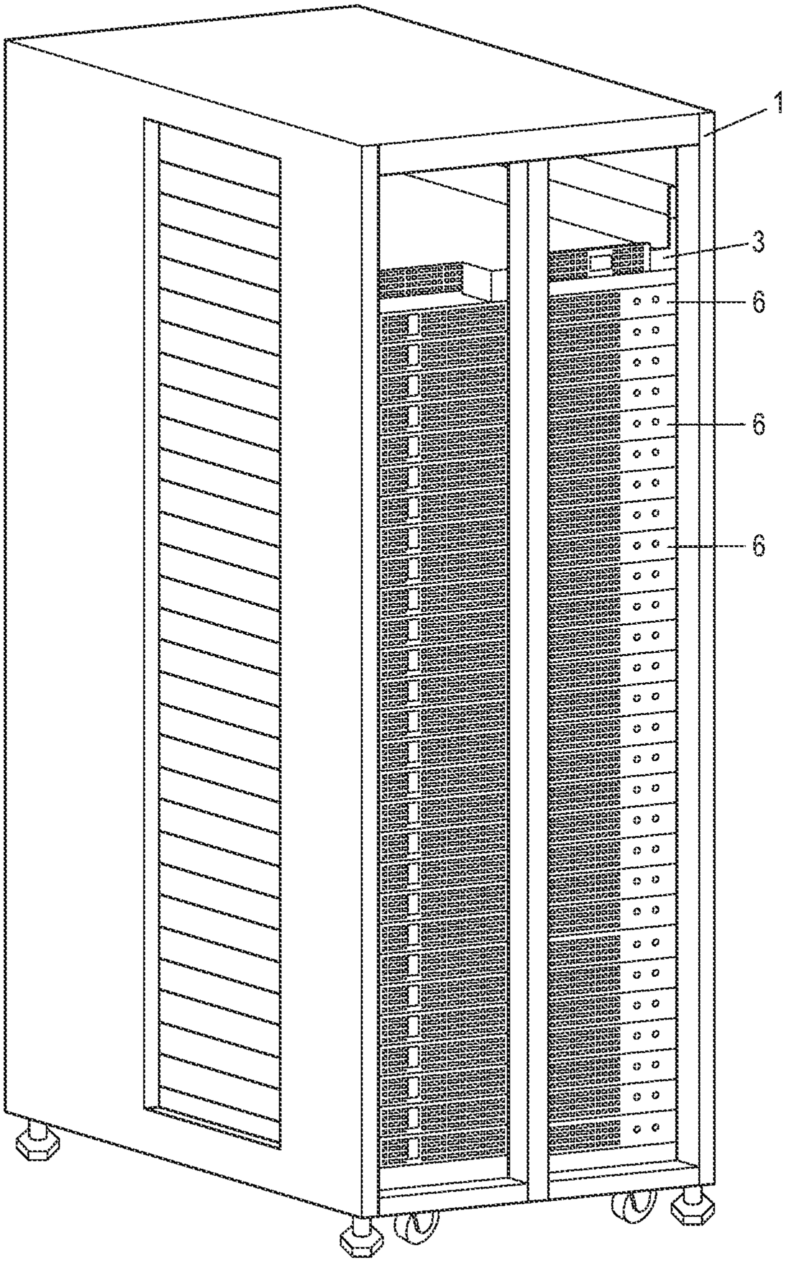
FIG. 1 is a schematic diagram showing a conventional rack with a heat-dissipation system.
Figure 2:
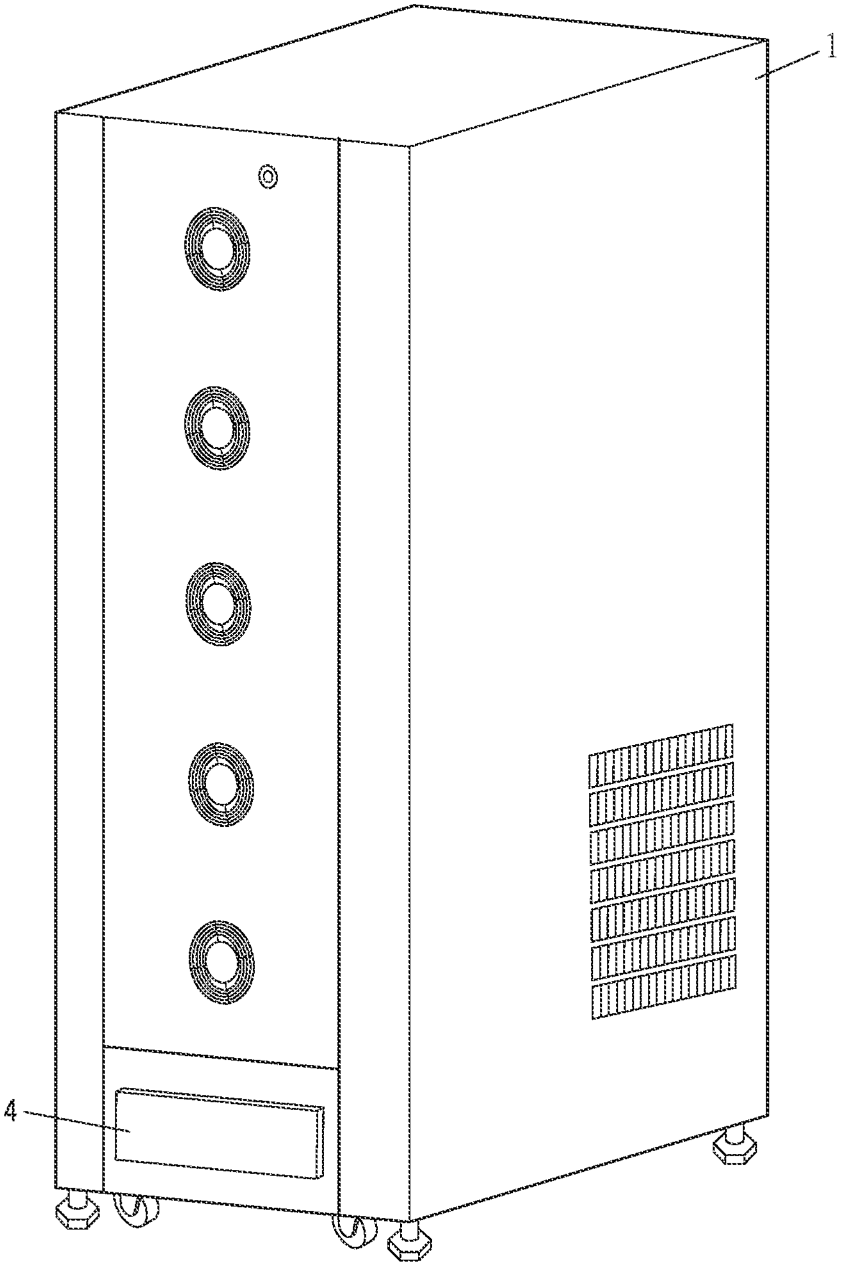
FIG. 2 is another schematic diagram of the conventional rack with a heat-dissipation system as shown in FIG. 1.
Figure 5:
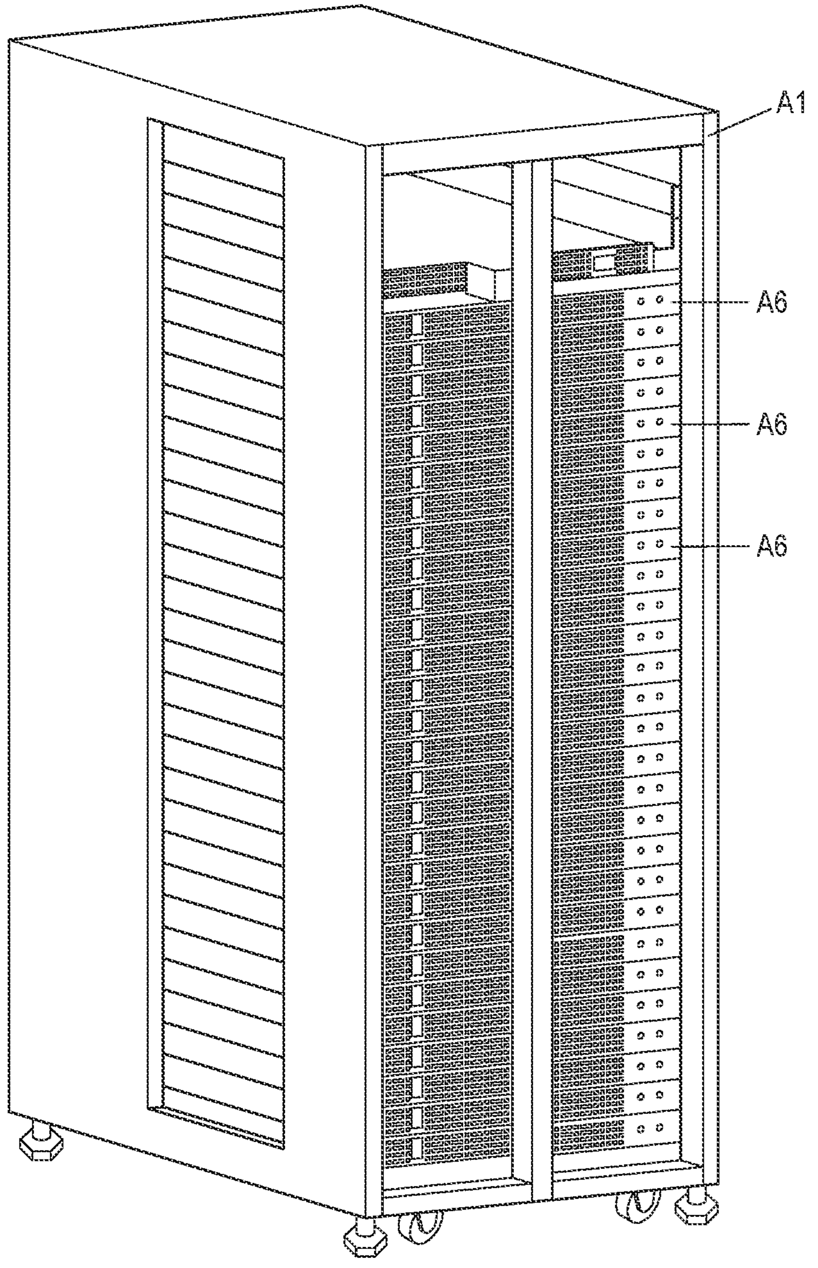
FIG. 5 is a schematic diagram showing a rack with a heat-dissipation system according to an embodiment of this disclosure.
Figure 6:
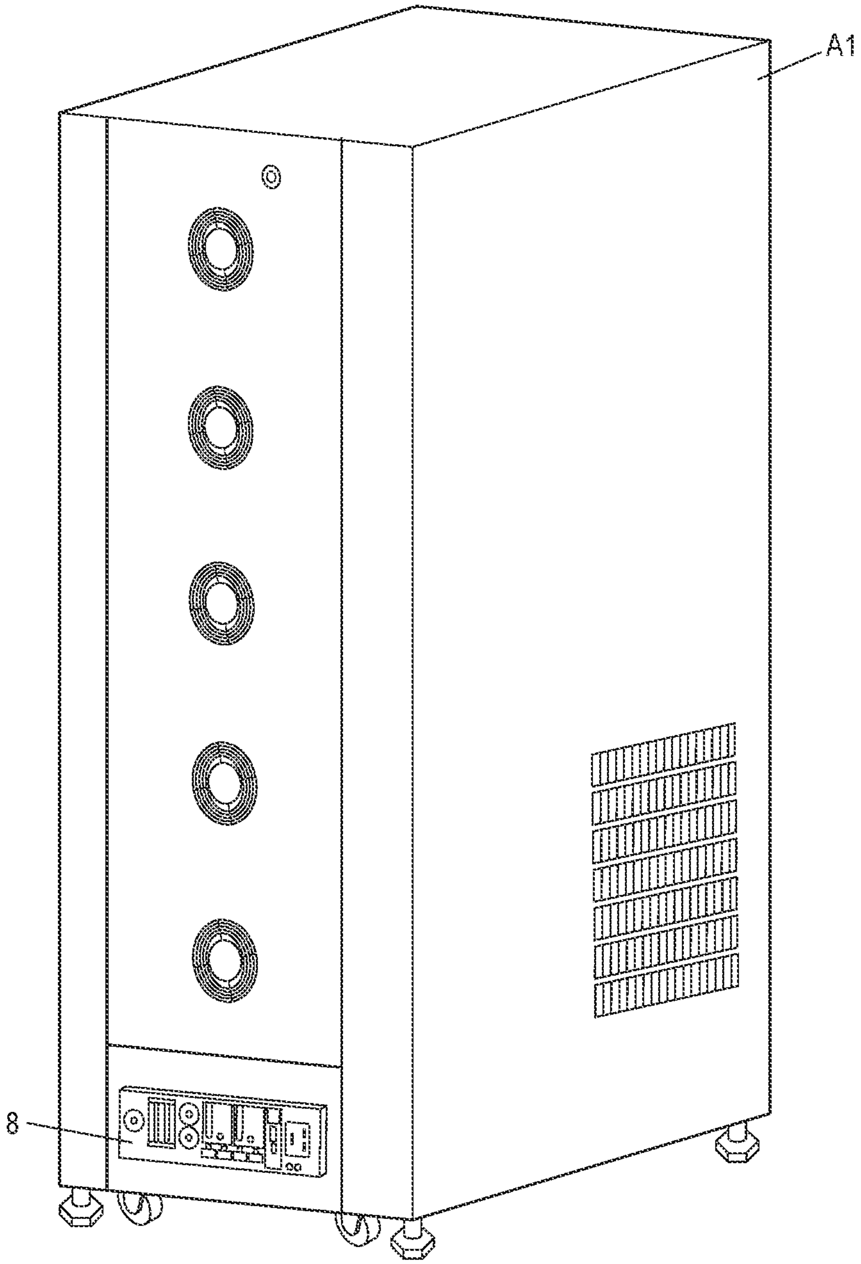
FIG. 6 is another schematic diagram of the rack with a heat-dissipation system according to the embodiment of this disclosure.

As shown in FIGS. 5 and 6, similar to the rack body 1 of FIGS. 1 and 2, the rack body A1 of this embodiment is a hollow body for accommodating a plurality of electronic apparatuses A6 (i.e., server apparatuses), which usually generate a lot of heat during operation.

Figure 3:
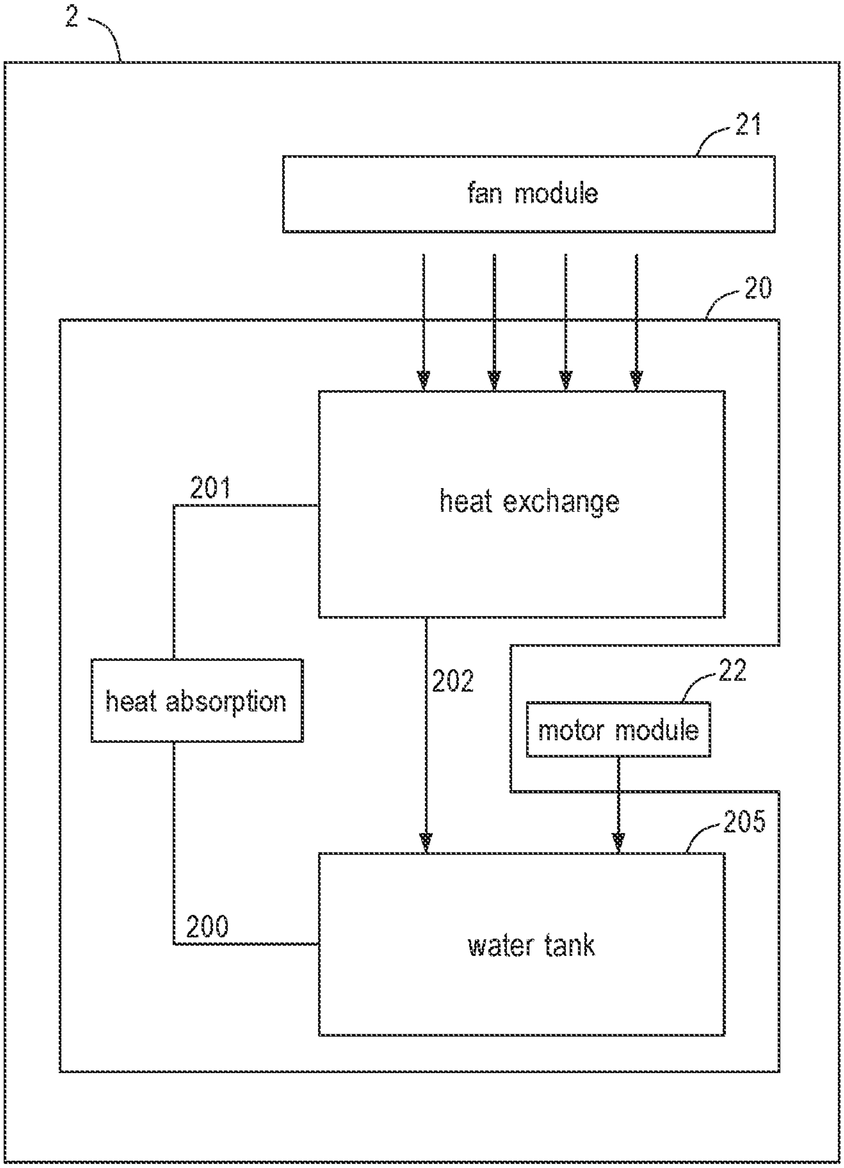
FIG. 3 is a block diagram of the conventional heat-dissipation system installed inside the rack.
Figure 4:
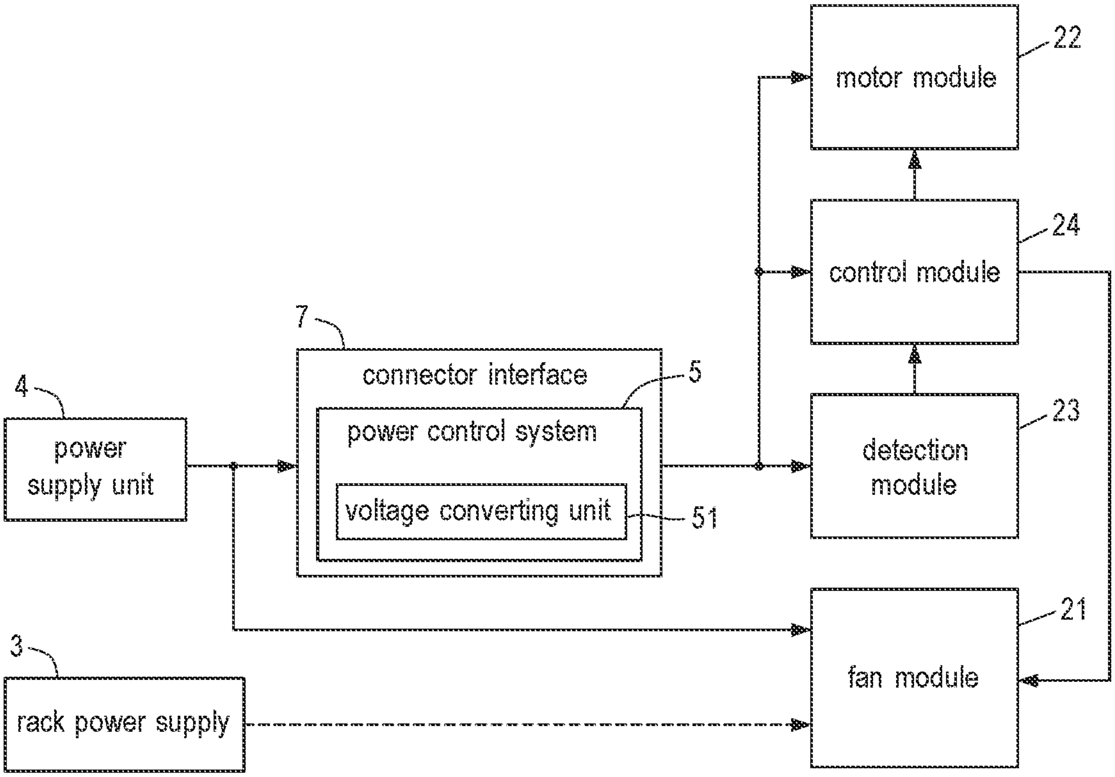
FIG. 4 is a block diagram of the conventional power supply system applied to the conventional rack with a heat-dissipation system.
Figure 7:
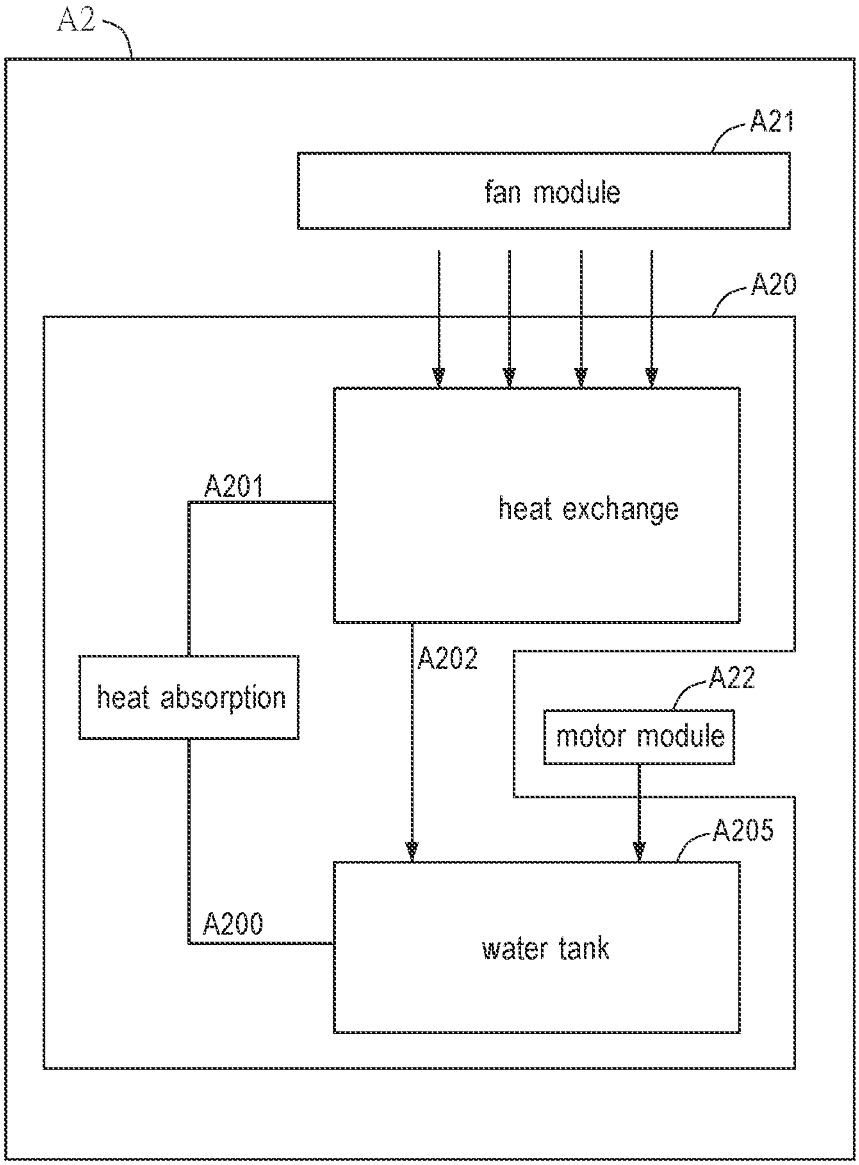
FIG. 7 is a block diagram of the heat-dissipation system installed inside the rack according to the embodiment of this disclosure.

As shown in FIG. 7, similar to the heat-dissipation system 2 of FIG. 3, the heat-dissipation system A2 of this embodiment is configured for cooling the electronic apparatuses A6 and includes a water circulation system A20, a fan module A21 for heat exchange with the water circulation system A20, and a motor module A22 for driving the water circulation system A20. The water circulation system A20, the fan module A21 and the motor module A22 are installed inside the rack body A1.

The water circulation system A20 includes a cold water pipe A200 for transmitting the cold water from a water tank A205 to the electronic apparatuses A6 for heat dissipation, a heated water pipe A201 for outputting the heated water, after absorbing the heat generated by the electronic apparatuses A6, and a recycle water pipe A202 for transmitting the cold water, after heat exchange with the fan module A21, back the water tank A205. The water circulation system A20 is driven by the motor module A22.

Figure 8:
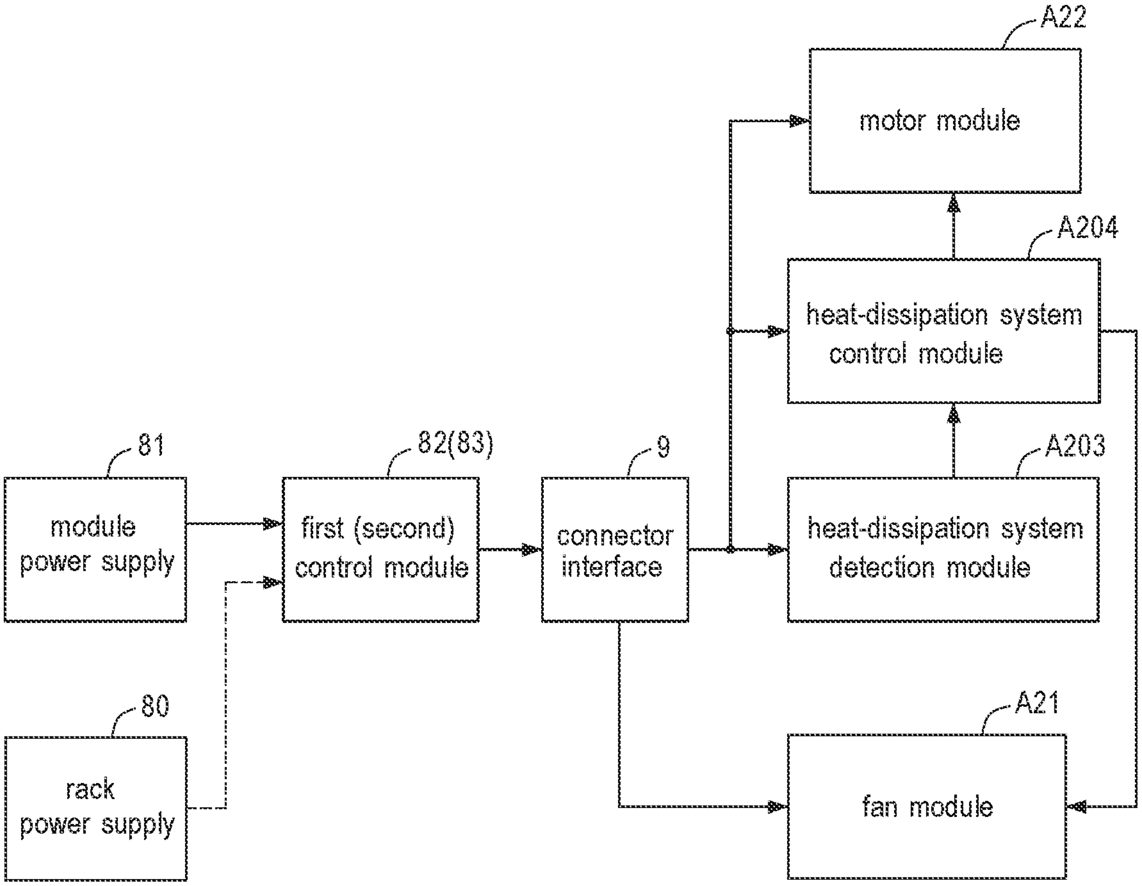
FIG. 8 is a block diagram of the power supply system applied to the rack with a heat-dissipation system according to the embodiment of this disclosure.

As shown in FIG. 8, the heat-dissipation system A2 further includes a heat-dissipation system detection module A203 for detecting the temperature value, the flow value and the pressure value of the water circulation system 20 and the temperature value inside the rack body A1, and a heat-dissipation system control module A204 for controlling the rotation speeds of the motor module A22 and the fan module A21 according to the values detected by the heat-dissipation system detection module A203. When the heat-dissipation system detection module A203 detects that the temperature inside the rack body A1 is greater than a preset value, the heat-dissipation system control module A204 controls the fan module A21 and/or the motor module A22 to increase the rotation speed of the fan module A21 and/or the rotation speed of the motor module A22.

Figure 9:
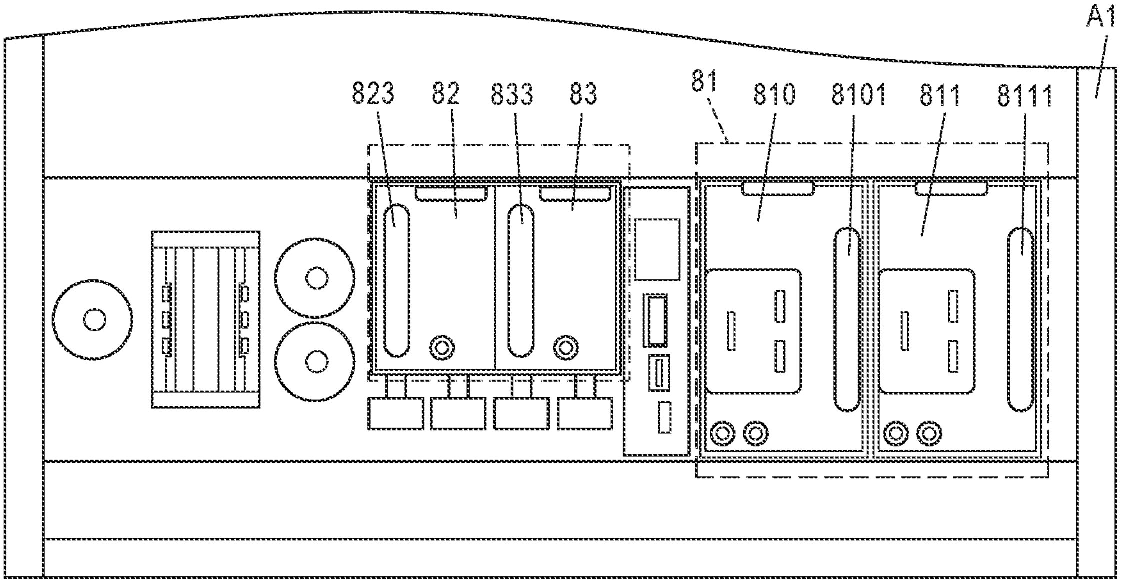
FIG. 9 is a schematic diagram showing the installation of the power supply system applied to the rack with a heat-dissipation system according to the embodiment of this disclosure.
Figure 10:
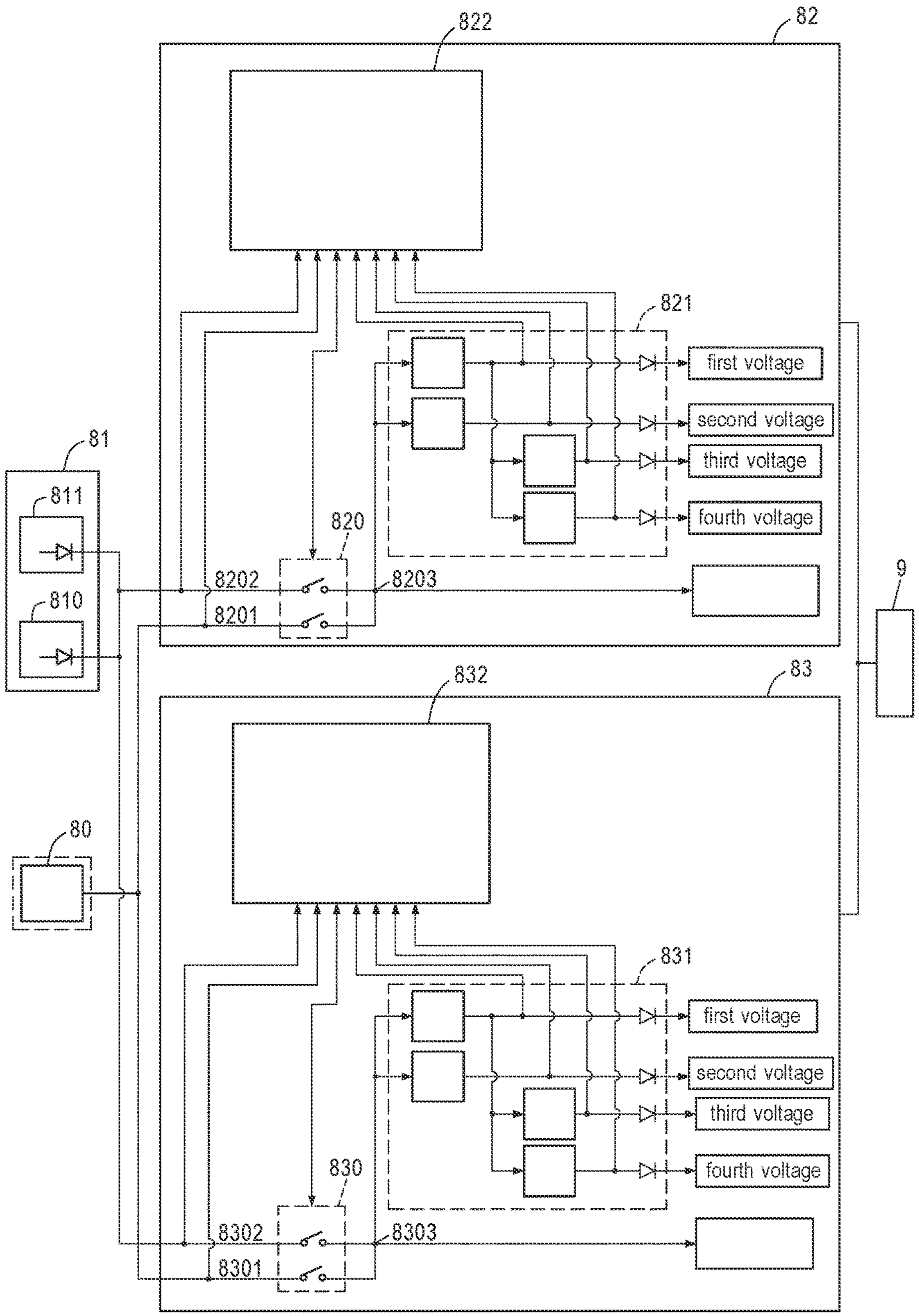
FIG. 10 is a block diagram of the power control system of the rack heat-dissipation system according to an embodiment of this disclosure.

Referring to FIG. 9, the power supply system 8 includes a rack power supply 80 installed in the rack body A1, a module power supply 81 installed in the rack body A1 by hot-swapping (or hot-plugging), and a first control module 82 and a second control module 83 that are installed in the rack body A1 by hot-swapping (or hot-plugging) and operating in parallel. The first control module 82 and the second control module 83 together construct a power control system.

In this embodiment, the rack power supply 80 is arranged inside the rack body A1 and is located at the top of the rack body A1. In other embodiments, the rack power supply 80 can be arranged at any of other positions in the rack body A1. The rack power supply 80 is configured to provide the electric power for the entire rack and output an output voltage.

Referring to FIG. 6, in this embodiment, the module power supply 81 is installed at the rear part of the rack body A1 by hot-swapping (or hot-plugging) and is configured to provide the electric power for the heat-dissipation system A2. In other embodiments, the module power supply 81 can be arranged at any of other positions in the rack body A1. The module power supply 81 includes a first power supply 810 and a second power supply 811. Each of the first power supply 810 and the second power supply 811 outputs an output voltage identical to the output voltage of the rack power supply 80. In addition, the first power supply 810 is configured with a handle 8101, and the second power supply 811 is configured with a handle 8111. The configuration of the handles 8101 and 8111 can make the operation of hot plugging the first power supply 810 and the second power supply 811 (the module power supply 81) more convenience.

In this embodiment, the first control module 82 is arranged at the rear part of the rack body A1 by hot-swapping (or hot-plugging), and the first control module 82 is also configured with a handle 823, so that the operation of hot plugging the first control module 82 is more convenience. The first control module 82 includes a first switching unit 820, a first voltage converting unit 821 and a first monitoring unit 822.

The first switching unit 820 has a first input terminal 8201 for electrically connecting the rack power supply 80, a second input terminal 8202 for electrically connecting the first power supply 810 and the second power supply 811, and an output terminal 8203. The first switching unit 820 can be controlled to switch one of the first input terminal 8201 and the second input terminal 8202 to couple with the output terminal 8203, or to enable both of the first input terminal 8201 and the second input terminal 8202 to couple with the output terminal 8203.

The first voltage converting unit 821 is electrically connected to the output terminal 8203 of the first switching unit 820 for receiving one or two of the output voltages of the rack power supply 80 and the module power supply 81. The first voltage converting unit 821 is electrically connected to the fan module A21, the motor module A22, the heat-dissipation system detection module A203 and the heat-dissipation system control module A204 via a connector interface 9, which is fixed in the rack body A1. In this case, the first voltage converting unit 821 can output a first voltage to the fan module A21, a second voltage to the motor module A22, a third voltage to the heat-dissipation system detection module A203, and a fourth voltage to the heat-dissipation system control module A204. The first to fourth voltages can be all the same or all different, or they can be partially the same and partially different. The values of the first to fourth voltages are optional based on the design.

The first monitoring unit 822 is electrically connected to the rack power supply 80, the first power supply 810 and the second power supply 811 of the module power supply 81, the first switching unit 820, and the first voltage converting unit 821.

When the first monitoring unit 822 detects that the output voltages of the rack power supply 80, the first power supply 810, and the second power supply 811 are all normal, the first monitoring unit 822 controls the first switching unit 820 to enable the first voltage converting unit 821 to receive only the output voltage of the rack power supply 80 or the output voltages of the first power supply 810 and the second power supply 811, or to enable the first voltage converting unit 821 to receive all of the output voltages of the rack power supply 80, the first power supply 810 and the second power supply 811. In practice, when the first monitoring unit 822 detects that the output voltages of the first power supply 810 and the second power supply 811 are normal, the first monitoring unit 822 controls the first switching unit 820 to enable the first voltage converting unit 821 to receive only the output voltages of the first power supply 810 and the second power supply 811.

In addition, when the first monitoring unit 822 detects that the output voltage of the rack power supply 80 is abnormal, the first monitoring unit 822 controls the first switching unit 820 to enable the first voltage converting unit 821 to receive only the output voltages of the first power supply 810 and the second power supply 811.

In one aspect, when the first monitoring unit 822 detects that any one of the first to fourth voltages outputted from the first voltage converting unit 821 is abnormal, the first monitoring unit 822 controls the first switching unit 820 to enable the first voltage converting unit 821 to stop receiving the output voltages of the rack power supply 80, the first power supply 810 and the second power supply 811, so that the first voltage converting unit 821 stops outputting the abnormal one of the first to fourth voltages.

In this embodiment, the second control module 83 is arranged at the back surface of the rack body A1 by hot-swapping (or hot-plugging), and the second control module 83 is also configured with a handle 833, so that the operation of hot plugging the second control module 83 is more convenience. The second control module 83 includes a second switching unit 830, a second voltage converting unit 831 and a second monitoring unit 832.

The second switching unit 830 has a first input terminal 8301 for electrically connecting the rack power supply 80, a second input terminal 8302 for electrically connecting the first power supply 810 and the second power supply 811, and an output terminal 8303. The second switching unit 830 can be controlled to switch one of the first input terminal 8301 and the second input terminal 8302 to couple with the output terminal 8303, or to enable both of the first input terminal 8301 and the second input terminal 8302 to couple with the output terminal 8303.

The second voltage converting unit 831 is electrically connected to the output terminal 8303 of the second switching unit 830 for receiving one or two of the output voltages of the rack power supply 80 and the module power supply 81. Similar to the first voltage converting unit 821, the second voltage converting unit 831 is also electrically connected to the fan module A21, the motor module A22, the heat-dissipation system detection module A203 and the heat-dissipation system control module A204 via the connector interface 9, which is fixed in the rack body A1. In this case, the second voltage converting unit 831 can output a first voltage to the fan module A21, a second voltage to the motor module A22, a third voltage to the heat-dissipation system detection module A203, and a fourth voltage to the heat-dissipation system control module A204.

The second monitoring unit 832 is electrically connected to the rack power supply 80, the first power supply 810 and the second power supply 811 of the module power supply 81, the second switching unit 830, and the second voltage converting unit 831.

When the second monitoring unit 832 detects that the output voltages of the rack power supply 80, the first power supply 810, and the second power supply 811 are all normal, the second monitoring unit 832 controls the second switching unit 830 to enable the second voltage converting unit 831 to receive only the output voltage of the rack power supply 80 or the output voltages of the first power supply 810 and the second power supply 811, or to enable the second voltage converting unit 831 to receive all of the output voltages of the rack power supply 80, the first power supply 810 and the second power supply 811. In practice, when the second monitoring unit 832 detects that the output voltages of the first power supply 810 and the second power supply 811 are normal, the second monitoring unit 832 controls the second switching unit 830 to enable the second voltage converting unit 831 to receive only the output voltages of the first power supply 810 and the second power supply 811.

In addition, when the second monitoring unit 832 detects that the output voltage of the rack power supply 80 is abnormal, the second monitoring unit 832 controls the second switching unit 830 to enable the second voltage converting unit 831 to receive only the output voltages of the first power supply 810 and the second power supply 811.

In one aspect, when the second monitoring unit 832 detects that any one of the first to fourth voltages outputted from the second voltage converting unit 831 is abnormal, the second monitoring unit 832 controls the second switching unit 830 to enable the second voltage converting unit 831 to stop receiving the output voltages of the rack power supply 80, the first power supply 810 and the second power supply 811, so that the second voltage converting unit 831 stops outputting the abnormal one of the first to fourth voltages.

The heat-dissipation system detection module A203 also detects whether the statuses of the fan module A21 and the motor module A22 are normal or not, and it is electrically connected to the first monitoring unit 822 and the second monitoring unit 832. When the heat-dissipation system detection module A203 detects that the statuses of the fan module A21 and/or the motor module A22 are/is abnormal, the first monitoring unit 822 and the second monitoring unit 832 respectively control the first voltage converting unit 821 and the second voltage converting unit 831 to stop outputting the first voltage and/or the second voltage.

As mentioned above, since the present disclosure is configured with the first control module 82 and the second control module 83 based on the concept of redundancy, when the electronic components constituting the first voltage converting unit 821 of the first control module 82 are damaged due to limited lifespan, the second voltage converting unit 831 of the second control module 83 can still provide the normal function, so that the fan module A21, the motor module A22, the heat-dissipation system detection module A203 and the heat-dissipation system control module A204 of the heat-dissipation system A2 can still work normally. Thus, the shutdown of the entire rack caused by the bad heat dissipation can be avoided, thereby greatly improving the reliability level in the computer room evaluation and preventing the business loss due to the shutdown of the rack. Another advantage of this disclosure is that since the first control module 82 and the second control module 83 are installed in the rack body A1 by hot-swapping (or hot-plugging), if the electronic components of the first voltage converting unit 821 or the second voltage converting unit 831 are damaged, the repairing can be easily performed by unplugging the first voltage converting unit 821 or the second voltage converting unit 831 to be repaired. This design can sufficiently reduce the difficulty of repairing and the repairing time. In addition, since the output voltages of the rack power supply 80 and the module power supply 81 are not inputted to the fan module A21 at the same time, the fan module A21 does not have to choose one of the power supplies, and the module power supply 81 of the heat-dissipation system A2 does not need to support the entire rack, so that the module power supply 81 of the heat-dissipation system A2 will not be shut down, thereby avoiding the shutdown of the entire rack due to bad heat dissipation.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A power control system of a rack heat-dissipation system, wherein the power control system receives output voltages of a rack power supply and a module power supply, and the heat-dissipation system comprises a water circulation system for heat dissipation, a fan module for heat exchange with the water circulation system, and a motor module for driving the water circulation system, the power control system comprising:

a first control module and a second control module that are operating in parallel; wherein, the first control module comprises:

a first switching unit electrically connected to the rack power supply and the module power supply, wherein the first switching unit has a first input terminal configured to be electrically connected to the rack power supply, a second input terminal configured to be electrically connected to the module power supply, and an output terminal;

a first voltage converting unit electrically connected to the output terminal of the first switching unit, wherein the first voltage converting unit receives one or two of output voltages of the rack power supply and the module power supply, and outputs at least one first voltage for the fan module and/or the motor module of the heat-dissipation system; and a first monitoring unit electrically connected to the rack power supply, the module power supply, the first switching unit and the first voltage converting unit;

wherein, the first monitoring unit detects the output voltages of the rack power supply and the module power supply, the first monitoring unit controls the first switching unit to enable both of the first input terminal and the second input terminal of the first switching unit to be simultaneously coupled with the output terminal of the first switching unit, such that the first voltage converting unit simultaneously receives both of the output voltages of the rack power supply and the module power supply;

the second control module comprises:

a second switching unit electrically connected to the rack power supply and the module power supply, wherein the second switching unit has a first input terminal configured to be electrically connected to the rack power supply, a second input terminal configured to be electrically connected to the module power supply, and an output terminal;

a second voltage converting unit electrically connected to the output terminal of the second switching unit, wherein the second voltage converting unit receives one or two of the output voltages of the rack power supply and the module power supply, and outputs the at least one first voltage; and a second monitoring unit electrically connected to the rack power supply, the module power supply, the second switching unit and the second voltage converting unit;

wherein, the second monitoring unit detects the output voltages of the rack power supply and the module power supply, the second monitoring unit controls the second switching unit to enable both of the first input terminal and the second input terminal of the second switching unit to be simultaneously coupled with the output terminal of the second switching unit, such that the second voltage converting unit simultaneously receives both of the output voltages of the rack power supply and the module power supply, wherein the first voltage converting unit outputs the first voltage to the fan module of the heat-dissipation system, and the first voltage converting unit further outputs a second voltage to the motor module of the heat-dissipation system.

2. The power control system of claim 1, wherein the first monitoring unit detects the first voltage outputted by the first voltage converting unit, the first monitoring unit controls the first switching unit to enable the first voltage converting unit to stop receiving the output voltages of the rack power supply and the module power supply, so that the first voltage converting unit stops outputting the first voltage; and wherein the second monitoring unit detects the first voltage outputted by the second voltage converting unit, the second monitoring unit controls the second switching unit to enable the second voltage converting unit to stop receiving the output voltages of the rack power supply and the module power supply, so that the second voltage converting unit stops outputting the first voltage.

3. The power control system of claim 1, wherein the heat-dissipation system further comprises a heat-dissipation system detection module electrically connected to the first monitoring unit, the second monitoring unit, the fan module and the motor module; and the heat-dissipation system detection module detects the fan module and/or the motor module, the first monitoring unit and the second monitoring unit respectively control the first voltage converting unit and the second voltage converting unit to stop outputting the first voltage and/or the second voltage.

4. A power supply system, which is applied to a rack with a heat-dissipation system, wherein the heat-dissipation system comprises a water circulation system for heat dissipation, a fan module for heat exchange with the water circulation system, and a motor module for driving the water circulation system, and the water circulation system, the fan module and the motor module are installed in the rack, the power supply system comprising:

a rack power supply for outputting an output voltage;

a module power supply installed in the rack by hot-swapping, wherein the module power supply comprises a first power supply and a second power supply, and each of the first power supply and the second power supply outputs an output voltage identical to the output voltage of the rack power supply; and a first control module and a second control module that are installed in the rack by hot-swapping and operating in parallel; wherein, the first control module comprises:

a first switching unit electrically connected to the rack power supply, the first power supply and the second power supply, wherein the first switching unit has a first input terminal configured to be electrically connected to the rack power supply, a second input terminal configured to be electrically connected to the module power supply, and an output terminal;

a first voltage converting unit electrically connected to the output terminal of the first switching unit, wherein the first voltage converting unit receives one or two of the output voltages of the rack power supply and the module power supply, and outputs at least one first voltage and a second voltage; and a first monitoring unit electrically connected to the rack power supply, the first power supply, the second power supply, the first switching unit and the first voltage converting unit;

wherein, the first monitoring unit detects the output voltages of the rack power supply, the first power supply and the second power supply, the first monitoring unit controls the first switching unit to enable both of the first input terminal and the second input terminal of the first switching unit to be simultaneously coupled with the output terminal of the first switching unit, such that the first voltage converting unit simultaneously receives all of the output voltages of the rack power supply, the first power supply and the second power supply;

the second control module comprises:

a second switching unit electrically connected to the rack power supply, the first power supply and the second power supply, wherein the second switching unit has a first input terminal configured to be electrically connected to the rack power supply, a second input terminal configured to be electrically connected to the module power supply, and an output terminal;

a second voltage converting unit electrically connected to the output terminal of the second switching unit, wherein the second voltage converting unit receives one or two of the output voltages of the rack power supply and the module power supply, and outputs the at least one first voltage and the second voltage; and a second monitoring unit electrically connected to the rack power supply, the first power supply, the second power supply, the second switching unit and the second voltage converting unit;

wherein, the second monitoring unit detects the output voltages of the rack power supply, the first power supply and the second power supply, the second monitoring unit controls the second switching unit to enable both of the first input terminal and the second input terminal of the second switching unit to be simultaneously coupled with the output terminal of the second switching unit, such that the second voltage converting unit simultaneously receives all of the output voltages of the rack power supply, the first power supply and the second power supply;

wherein, the fan module is electrically connected to the first voltage converting unit and the second voltage converting unit for receiving the first voltage; and wherein, the motor module is electrically connected to the first voltage converting unit and the second voltage converting unit for receiving the second voltage.

5. The power supply system of claim 4, wherein the first monitoring unit detects the first voltage and/or the second voltage outputted by the first voltage converting unit, the first monitoring unit controls the first switching unit to enable the first voltage converting unit to stop receiving the output voltages of the rack power supply and the module power supply, so that the first voltage converting unit stops outputting the first voltage and/or the second voltage; and wherein the second monitoring unit detects the first voltage and/or the second voltage outputted by the second voltage converting unit, the second monitoring unit controls the second switching unit to enable the second voltage converting unit to stop receiving the output voltages of the rack power supply and the module power supply, so that the second voltage converting unit stops outputting the first voltage and/or the second voltage.

6. The power supply system of claim 4, wherein the heat-dissipation system further comprises a heat-dissipation system detection module electrically connected to the first monitoring unit, the second monitoring unit, the fan module and the motor module; and the heat-dissipation system detection module detects the fan module and/or the motor module, the first monitoring unit and the second monitoring unit respectively control the first voltage converting unit and the second voltage converting unit to stop outputting the first voltage and/or the second voltage.

7. A rack with a heat-dissipation system, comprising:

a rack body;

the heat-dissipation system comprising a water circulation system for heat dissipation, a fan module for heat exchange with the water circulation system, and a motor module for driving the water circulation system, and the water circulation system, the fan module and the motor module are installed in the rack body; and a power supply system comprising:

a rack power supply installed in the rack body for outputting an output voltage;

a module power supply installed in the rack body by hot-swapping, wherein the module power supply comprises a first power supply and a second power supply, and each of the first power supply and the second power supply outputs the output voltage; and a first control module and a second control module that are installed in the rack body by hot-swapping and operating in parallel; wherein, the first control module comprises:

a first switching unit electrically connected to the rack power supply, the first power supply and the second power supply, wherein the first switching unit has a first input terminal configured to be electrically connected to the rack power supply, a second input terminal configured to be electrically connected to the module power supply, and an output terminal;

a first voltage converting unit electrically connected to the output terminal of the first switching unit, wherein the first voltage converting unit receives one or two of the output voltages of the rack power supply and the module power supply, and outputs at least one first voltage and a second voltage; and a first monitoring unit electrically connected to the rack power supply, the first power supply, the second power supply, the first switching unit and the first voltage converting unit;

wherein, the first monitoring unit detects the output voltages of the rack power supply, the first power supply and the second power supply, the first monitoring unit controls the first switching unit to enable both of the first input terminal and the second input terminal of the first switching unit to be simultaneously coupled with the output terminal of the first switching unit, such that the first voltage converting unit simultaneously receives all of the output voltages of the rack power supply, the first power supply and the second power supply;

the second control module comprises:

a second switching unit electrically connected to the rack power supply, the first power supply and the second power supply, wherein the second switching unit has a first input terminal configured to be electrically connected to the rack power supply, a second input terminal configured to be electrically connected to the module power supply, and an output terminal;

a second voltage converting unit electrically connected to the output terminal of the second switching unit, wherein the second voltage converting unit receives one or two of the output voltages of the rack power supply and the module power supply, and outputs the at least one first voltage and the second voltage; and a second monitoring unit electrically connected to the rack power supply, the first power supply, the second power supply, the second switching unit and the second voltage converting unit;

wherein, the second monitoring unit detects the output voltages of the rack power supply, the first power supply and the second power supply, the second monitoring unit controls the second switching unit to enable both of the first input terminal and the second input terminal of the second switching unit to be simultaneously coupled with the output terminal of the second switching unit, such that the second voltage converting unit simultaneously receives all of the output voltages of the rack power supply, the first power supply and the second power supply;

wherein, the fan module is electrically connected to the first voltage converting unit and the second voltage converting unit for receiving the first voltage; and wherein, the motor module is electrically connected to the first voltage converting unit and the second voltage converting unit for receiving the second voltage.

8. The rack of claim 7, wherein the first monitoring unit detects the first voltage and/or the second voltage outputted by the first voltage converting unit, the first monitoring unit controls the first switching unit to enable the first voltage converting unit to stop receiving the output voltages of the rack power supply, the first power supply and the second power supply, so that the first voltage converting unit stops outputting the first voltage and/or the second voltage; and wherein the second monitoring unit detects the first voltage and/or the second voltage outputted by the second voltage converting unit, the second monitoring unit controls the second switching unit to enable the second voltage converting unit to stop receiving the output voltages of the rack power supply, the first power supply and the second power supply, so that the second voltage converting unit stops outputting the first voltage and/or the second voltage.

9. The rack of claim 7, wherein the heat-dissipation system further comprises a heat-dissipation system detection module electrically connected to the first monitoring unit, the second monitoring unit, the fan module and the motor module; and the heat-dissipation system detection module detects the fan module and/or the motor module, the first monitoring unit and the second monitoring unit respectively control the first voltage converting unit and the second voltage converting unit to stop outputting the first voltage and/or the second voltage.

10. The rack of claim 9, wherein the heat-dissipation system further comprises a heat-dissipation system control module electrically connected to the heat-dissipation system detection module, the motor module and the fan module; and when the heat-dissipation system detection module detects that a temperature in the rack body is greater than a preset value, the heat-dissipation system control module controls the fan module and/or the motor module to increase a rotation speed of the fan module and/or a rotation speed of the motor module.

11. The rack of claim 7, further comprising a connector interface fixed in the rack body for electrically connecting the first voltage converting unit, the second voltage converting unit, the fan module and the motor module.

* * * * *